(12) United States Patent
Langendorf et al.

(10) Patent No.: US 6,725,349 B2
(45) Date of Patent: *Apr. 20, 2004

(54) METHOD AND APPARATUS FOR CONTROLLING OF A MEMORY SUBSYSTEM INSTALLED WITH STANDARD PAGE MODE MEMORY AND AN EXTENDED DATA OUT MEMORY

(75) Inventors: Brian K. Langendorf, Benicia, CA (US); James M. Dodd, Shingle Springs, CA (US); Nicholas D. Wade, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/389,092

(22) Filed: Mar. 13, 2003

(65) Prior Publication Data

US 2003/0177303 A1 Sep. 18, 2003

Related U.S. Application Data

(63) Continuation of application No. 08/814,697, filed on Mar. 11, 1997, now abandoned, which is a continuation of application No. 08/381,091, filed on Dec. 23, 1994, now abandoned.

(51) Int. Cl.$^7$ .............................................. G06F 12/00
(52) U.S. Cl. ........................ 711/170; 711/5; 711/105; 711/167; 714/719; 714/718; 365/189.01; 365/233; 365/233.05
(58) Field of Search ................ 711/115, 170, 711/171, 172, 104, 105, 167, 169, 211, 5; 365/189.01, 189.05, 233, 233.5; 714/718–723

(56) References Cited

U.S. PATENT DOCUMENTS

| | | | | |
|---|---|---|---|---|
| 5,210,856 A | * | 5/1993 | Auvinen et al. | 713/400 |
| 5,301,278 A | * | 4/1994 | Bowater et al. | 711/5 |
| 5,307,320 A | * | 4/1994 | Farrer et al. | 365/230.01 |
| 5,349,566 A | * | 9/1994 | Merritt et al. | 365/233.5 |
| 5,386,383 A | * | 1/1995 | Raghavachari | 365/189.05 |
| 5,457,659 A | * | 10/1995 | Schaefer | 365/222 |
| 5,526,320 A | * | 6/1996 | Zagar et al. | 365/233.5 |
| 5,532,961 A | * | 7/1996 | Mori et al. | 365/189.05 |
| 6,505,282 B1 | * | 1/2003 | Langendorf et al. | 711/170 |

* cited by examiner

*Primary Examiner*—Hong Kim
(74) *Attorney, Agent, or Firm*—Blakely, Sokoloff, Taylor & Zafman LLP (57) ABSTRACT

A method and apparatus for optimizing control on a bank to bank basis of a memory subsystem having a plurality of memory banks which are installed with different types of dynamic random access memory (DRAM) devices is presented. The present invention includes an improved DRAM controller comprises a set of configuration registers which store configuration bits corresponding to each memory bank in the main memory that is populated with the DRAM devices. The memory controller also includes a detection logic which together with a memory bank decode logic enables the memory controller determine whether a particular memory bank is populated with a page mode DRAM or an extended data out DRAM. The preferred embodiment also includes a column address strobe state machine which automatically controls timing requirements of both type of DRAM devices installed in the main memory to quickly and efficiently handle access requests.

12 Claims, 6 Drawing Sheets

FIG. 5
EDO DETECT WITH EDO DRAMs

FIG. 6
EDO DETECT WITH PAGE MODE DRAMs

FIG. 7

METHOD AND APPARATUS FOR CONTROLLING OF A MEMORY SUBSYSTEM INSTALLED WITH STANDARD PAGE MODE MEMORY AND AN EXTENDED DATA OUT MEMORY

This application is a continuation of Ser. No. 08/814,697 filed Mar. 11, 1997 now abandoned which is a continuation of Ser. No. 08/381,091 filed Dec. 23, 1994 now abandoned.

CROSS REFERENCE TO A RELATED APPLICATION

This application is related to a U.S. patent application Ser. No. 08/348,365, now U.S. Pat. No. 6,505,282 Jan. 7, 2003 entitled A Method and Apparatus for Integrating and Determining whether a Memory Subsystem is Installed with Standard Page Mode Memory and an Extended Data Out Memory, filed on Nov. 30, 1994, assigned to the assignee of the present invention and hereby incorporated by reference.

BACKGROUND OF THE INVENTION

1. Field of the Invention

The present invention relates to the field of computer system memory. More specifically, the present invention relates to an apparatus and a method for optimizing control of memory banks populated with standard page mode dynamic random access memory (DRAM) devices and extended data-out (EDO) DRAMs in a memory subsystem.

2. Description of Related Art

An important component of any computer system is a memory array. The memory array is used for storage of data and instructions for the processor and other resources in the computer system. Many prior art computers support a number of memory configurations in the memory subsystem. Some of these memory configurations are implemented by installing memory devices of various types and sizes in the memory banks of the memory subsystem.

In most prior art systems, the memory array comprises dynamic random access memory (DRAM) devices. Most system designers use the DRAM devices in main memory because of their relatively low cost and low power consumption. However, the demanding set-up and hold-times associated with DRAMs frequently prevents computer systems from realizing the greatest performance possible given a chosen microprocessor. For example, Intel's i486™ microprocessor is capable of performing four consecutive 32-bit reads; however, prior art DRAM main memories could not support such data bursting without complex interface circuitry.

To improve the performance of the DRAM devices, many system designers use page mode DRAMs. In a paged memory device memory is typically accessed by the underlying processor of the computer system by issuing an address that selects a particular location in the memory array. The address is then loaded into a memory controller which handles the task of providing row and column addresses used by the DRAM from the address provided by the processor. The additional hold timing requirement contributes to delays in the delivery of data to the processor.

To alleviate the delays caused in accessing data from the main memory, system designers use a fast performance DRAM device known as the Extended Data Out DRAM (EDO DRAM) which has the same packaging and power characteristics as the page mode DRAMs, but has different timing requirements than the standard page mode DRAMs and does not cause the delays that are characteristic of the standard page mode DRAMS.

The availability of EDO and standard page DRAM devices allow the system designer to design a memory system that can be entirely installed with either the EDO or standard page mode DRAMs. However, the system designer is not able to effectively integrate the EDO and page mode DRAM in the same system without incurring some penalties. For example, if a system designed to handle page mode DRAMs is integrated with EDO DRAMs, the system is not able derive the performance benefits of the EDO DRAMs because of the timing and control restraints imposed by the memory banks in the page mode DRAM system. Mixing the two DRAM types therefore slows performance since the EDO DRAM has to use page mode timings or will not work at all. Similarly, if a system designed to handle EDO DRAMs is integrated with page mode DRAMs, the user is not able to derive the performance advantages expected since the page mode DRAMs are not able to perform as fast as EDO DRAMs due to the differences in timing and control requirements.

Thus, a system that effectively preserves the performance of EDO DRAM banks while ensuring the correct operation of standard page mode DRAMs is needed.

SUMMARY OF THE INVENTION

The present invention provides a method and apparatus for optimizing memory banks populated with a standard page mode dynamic random access memory device (DRAM) and an extended data-out (EDO) DRAM in a memory subsystem. The preferred embodiment includes a DRAM controller that supports both EDO DRAMs and page mode DRAMs installed in different memory banks simultaneously in the memory subsystem. The DRAM controller includes a plurality of configuration registers-each a bit wide-having stored information that identifies the type of DRAM device installed in a memory bank. Particularly, each configuration register corresponds to one or more rows of memory banks of DRAMs installed in the memory subsystem.

The DRAM controller further includes a DRAM bank decoder having decoding logic for decoding bank locations responsive to address requests from the processor in the computer system to the memory subsystem. The preferred embodiment further includes a detection logic circuit for detecting bits specified by the configuration registers corresponding to each memory bank populated with a DRAM device. The detection logic uses the weak pull-down times during memory accesses to differentiate memory accesses to a memory bank installed with a standard page mode DRAM or an EDO DRAM. The detection logic in combination with the decode logic determines whether memory bank locations in the memory subsystem is populated or not.

Memory access control signals comprising a row address strobe (RAS), a column address strobe (CAS), and an address strobe (ADS) are utilized by the preferred embodiment for control and timing requirements of the DRAM devices installed in the memory subsystem. A CAS state machine controls the various states of accesses to the DRAM devices. The CAS state machine in combination with the detection logic determines whether an address received by the memory subsystem is designated to the standard page mode DRAM or the EDO DRAM.

Advantages of the DRAM controller of the preferred embodiment include the effective control of various types of DRAM memory devices with different control and timing requirements in the same memory subsystem without degrading performance. The preferred embodiment also has the advantage of automatically storing information for identifying the type of memory device installed in a memory bank to spare the system user the inconvenience of determining the memory type and then manually setting hardware switches to configure memory. The preferred embodiment further has the advantage of preserving the performance of the EDO DRAM banks and the correct operation of the page mode banks at a relatively low hardware cost. The preferred embodiment also allows the re-use of existing page mode DRAMs in new systems designed for EDO DRAMs, without sacrificing the performance of the EDO DRAMs that may already be installed in the new system.

The CAS state machine of the preferred embodiment allows memory access requests to either the standard page mode DRAM or the EDO DRAM without inserting an inordinate amount of wait states to slow the system down.

The features and advantages described in the specification are not all inclusive, and particularly, many additional features and advantages will be apparent to one of ordinary skill in the art in view of the drawings, specification and claims hereof. Moreover, it should be noted that the language used in the specification has been principally selected for readability and instructional purpose, and therefore resort to the claims is necessary to determine the inventive subject matter.

DETAILED DESCRIPTION OF THE PREFERRED EMBODIMENT

FIGS. 1 through 7 of the drawings disclose various embodiments of the present invention for purposes of illustration only. One skilled in the art will readily recognize from the following discussion that alternative embodiments of the structures and methods illustrated herein may be employed without departing from the principles of the invention.

Overview of the Computer System

Figure 1:
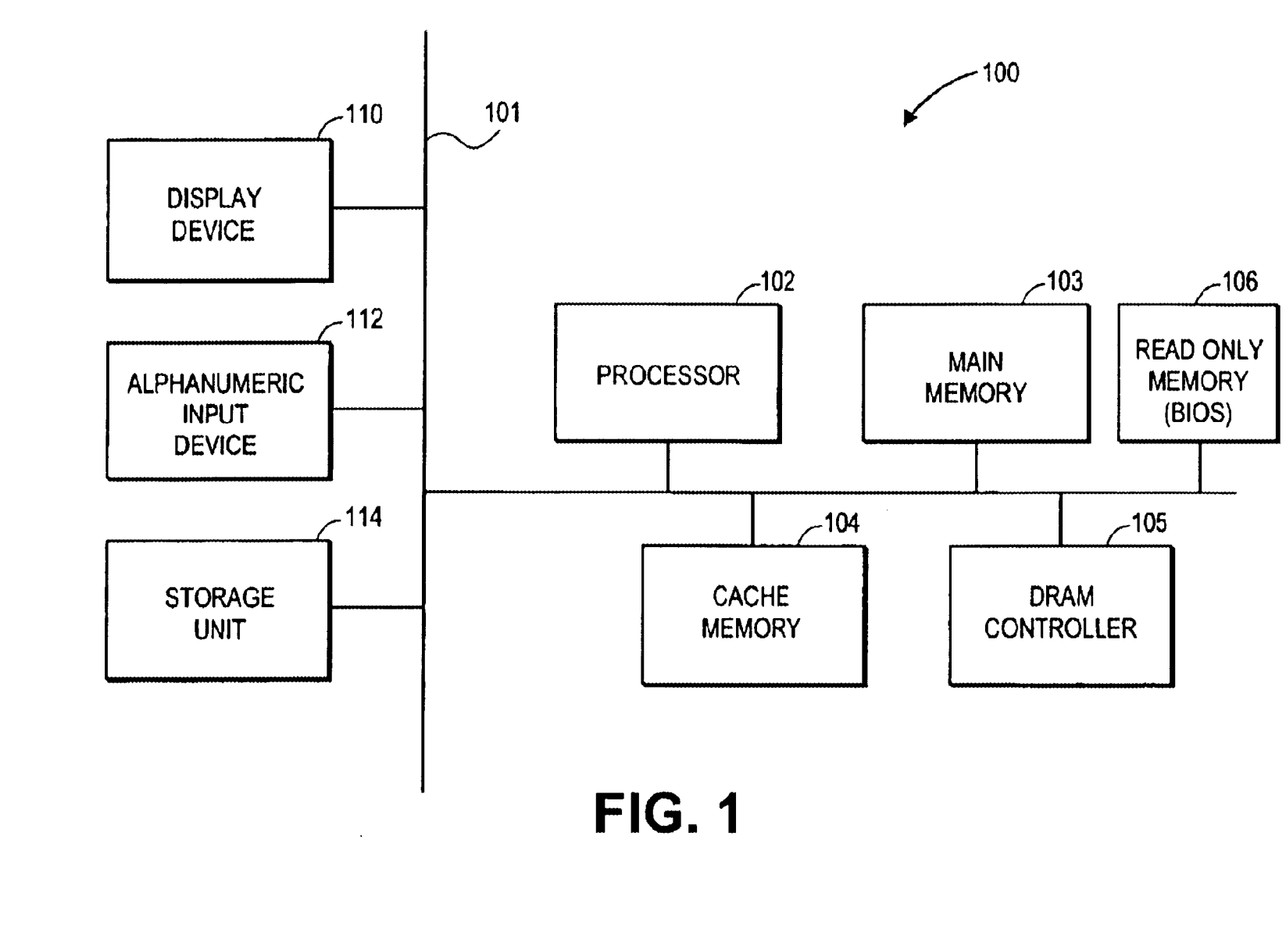
FIG. 1 is a block diagram illustration of a typical architecture of a computer system of the present invention.

Reference is first made to FIG. 1 which is a block diagram illustrating a computer system of the present invention. As illustrated in FIG. 1, a computer system 100 of the present invention generally comprises a bus 101 for communicating information, a processor 102 coupled to the bus 101 for processing instructions, a main memory 103 coupled to the bus 101 for storing data and instructions for the processor 102, and a cache memory 104 also coupled to the bus 101 for temporarily storing data and instructions for the processor 101. A dynamic random access memory (DRAM) controller 105 is also shown coupled to the bus 101 for controlling access to the main memory and a cache memory 104.

The computer system 100 also includes a display device 110 coupled to the bus 101 for displaying information to the computer user, an alphanumeric input device 112 coupled to the bus 101 for communication information and command selections to the processor 102, and a storage device 114 also coupled to the bus 101 for storing data for the computer system 100.

Figure 2:
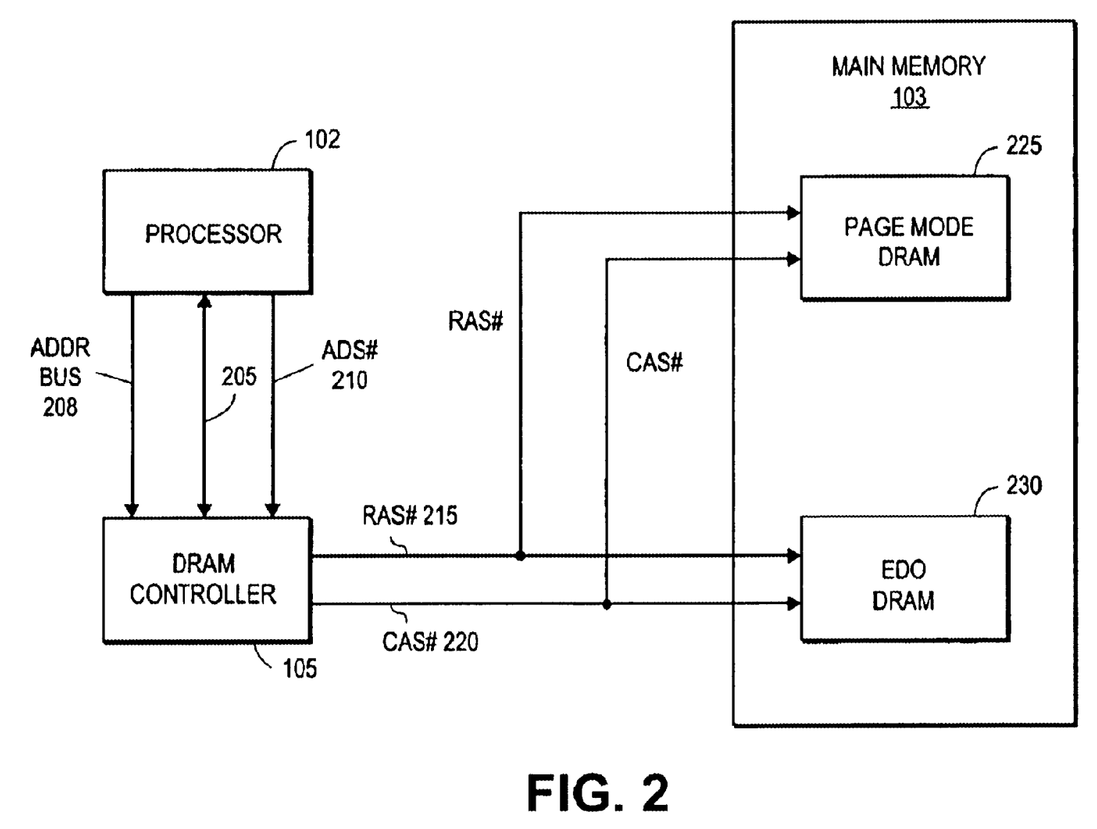
FIG. 2 is a block diagram illustrating a processor, a dynamic random access memory (DRAM) memory controller, and memory including both a standard page mode DRAM device and an extended data-out DRAM.

Reference is now made to FIG. 2, which is a block diagram illustrating one embodiment of the preferred embodiment of the present invention. As illustrated in FIG. 2, the processor 102 is coupled to the DRAM controller 105 via an address bus 208 and data bus 205, address requests are sent to the main memory 103. An Address Strobe (ADS#) signal 210 is used by the processor 102 to initiate a read or write cycle to the memory subsystem by asserting the ADS# signal 210.

The DRAM controller 105 is coupled to the main memory 103 including a plurality of mixed memory devices including a standard page mode DRAM device 225 and an Extended Data Out DRAM (EDO) device 230, which are organized into columns and rows. From the DRAM controller 105, a Row Address Strobe (RAS#) signal 215 and the Column Address Strobe (CAS#) signal 220 are supplied to each memory device 225 and 230. The ADS# 210, the RAS# 215, and the CAS# 220 signals are labeled with a "#" to indicate that the signals are low when asserted (i.e., active low).

In a normal mode of operation, the processor 102 applies an address and control signals to address bus 200 and asserts the ADS# signal 210 to the DRAM controller 105. The DRAM controller 105 receives the address and control signals from the bus 101. Responsive to the address and control signals from the processor 102, the DRAM controller 105 signals to the main memory 103 via the CAS# 220 and RAS# 215 signals. On receipt of the memory access control signals from the DRAM controller 105, data is transferred via the data bus 205 into either the EDO 230 or standard page mode DRAM 225 for a write operation, or data is transferred from either of the DRAMs 225 or 230 for a read operation.

Figure 3:
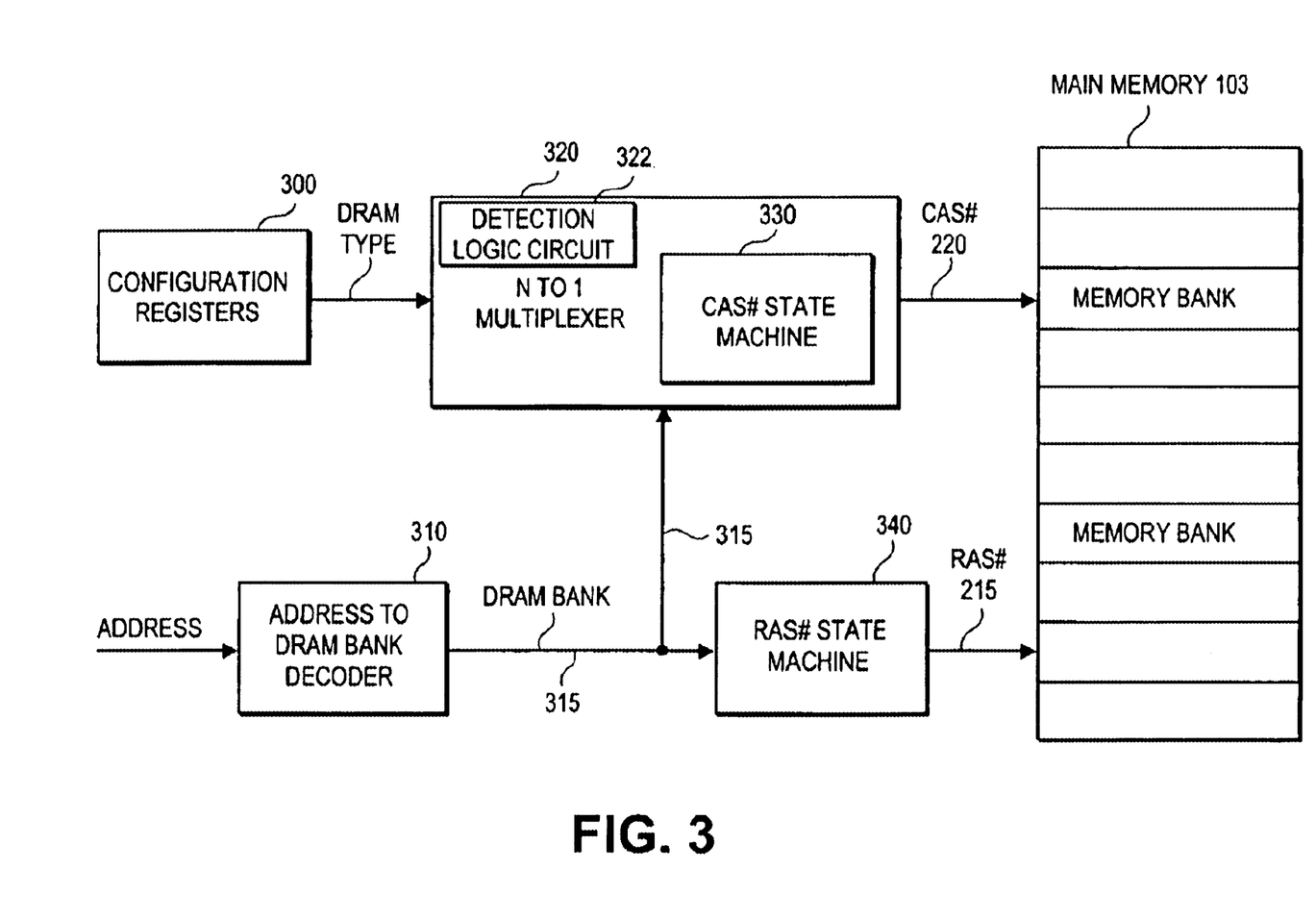
FIG. 3 is a block diagram of the memory controller including configuration registers, a bank decoder, a Column address strobe (CAS), a Row address strobe (RAS) state machines, and a selector including a detection logic circuit.

Reference is now made to FIG. 3, which is a block diagram illustrating the internal architecture of one embodiment of the DRAM controller 105 of the preferred embodiment. Some of the components and the operation of the DRAM controller 105 are well known in the art and will not be described in detail. However, the DRAM controller of the preferred embodiment includes a plurality of configuration registers 300, each storing information identifying the DRAM device stored in a memory bank, a DRAM bank decoder 310 including decoding logic for decoding address requests to the various memory bank locations, and a multiple input select multiplexer 320 including detection logic circuitry for sizing up a memory bank and determining the type of DRAM installed in a particular bank during initialization of the computer system 100. The select multiplexer 320 is coupled to a CAS# state machine 330. The select multiplexer 320 receives decoded addresses of memory location responsive to memory access requests by the processor 102, from the address decoder 310. The select multiplexer 320 uses the decoded address and information received from the configuration registers 300 to select a corresponding memory bank to memory requests by the processor 102.

The memory controller 105 also includes a RAS# state machine 340 which is coupled to the DRAM bank decoder 310 and the select multiplexer 320 via a decode lines 335. The address bank decoder 310 also couples to the ADS# signal 215 from the processor 102. The DRAM controller 105 also includes a column address strobe state machine 330 that generates the CAS# signal 220 and a row column address strobe state machine 340 that generates the RAS# signal 215. The function of the RAS state machine which is well known in the art will not be described in detail.

Still referring to FIG. 3, the memory configuration registers 300 store information related to memory devices installed in the main memory 103. In the preferred embodiment, the number of registers corresponds to the number of memory banks in the main memory 103. Configuration information is loaded into each of the registers during initialization of the computer system and any subsequent addition of a DRAM device to the computer system after initialization. The DRAM controller 105 of the preferred embodiment also includes a detection logic to determine memory pull-ups or pull-downs depending on the configuration information presented by the system BIOS.

The address bank decoder 310 including decoding logic decodes the DRAM bank location in the main memory 103 in response to an address presented by the processor 102. The bank decoder 310 generates a decode address which is supplied to the select multiplexer 320 and the RAS# state machine 330 via DRAM bank lines 315.

During a normal system boot operation of the preferred, the system BIOS (not shown) configures boot registers that configure the various memory banks in the system. The system BIOS then presents this information to the configuration registers 300 to be stored so that the DRAM controller 105 knows the contents of each bank of memory in the system (i.e., whether a bank contains EDO or standard DRAM). In the memory controller of the preferred embodiment, each of the configuration registers is one bit in width and is set by the DRAM controller 105 when a corresponding memory bank containing the DRAM devices is being accessed. During a read operation to the main memory 103, the DRAM controller 105 presents the configuration information to the select multiplexer 320 so that access requests to a specific memory bank is decoded and the appropriate DRAM device is selected. After selecting the appropriate DRAM device based on the decode and the configuration information, the select multiplexer 320 signals the CAS# state machine 330 which then controls the timing requirements of the particular DRAM device being accessed. The operation of the CAS# state machine is described in detail in FIG. 4. Although the configuration registers 300 and the CAS# state machine 330 as described are embodied in the DRAM controller 105 of the preferred embodiment, the configuration registers 300, the CAS# state machine 330 may be implemented in other components of the computer system 100.

Figure 4:
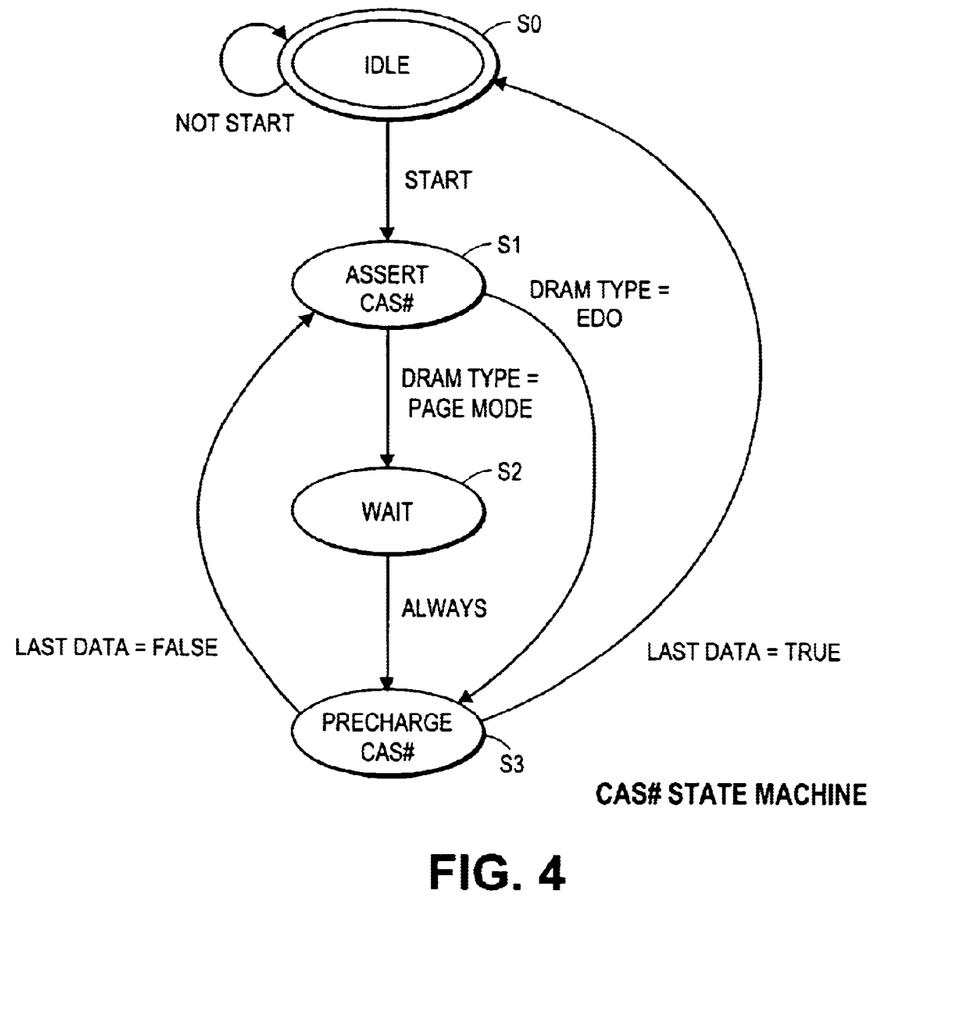
FIG. 4 is a state diagram of the CAS state machine illustrating the various states of the CAS signal during an address request to the standard page mode DRAM and the EDO DRAM.

Referring now to FIG. 4 is a state diagram of one embodiment of the CAS# state machine 330 of the DRAM controller 105 of the preferred embodiment. As discussed earlier, the DRAM memory array of the preferred embodiment is organized as a number of rows. Each row spans one or more banks, depending upon the number of banks populated in a particular memory configuration.

Each row is also organized as comprising a number of pages such that any time an access is made in the main memory 103, that location resides in a certain page of the rows. For completing a memory access, the certain page is activated and the referenced data is read. Activation of a page involves a hardware precharge cycle and requires a period of time as well known in the art. In the page mode operation as described earlier, significant performance can be gained if successive accesses to memory are written to the same page. Because of such successive accesses, a refresh cycle after an access to a page will necessitate reopening of that page causing delays in read operations to the page mode DRAM device.

As illustrated in FIG. 4, the CAS state machine 330 is controlled differently depending upon the type of DRAM device. In other words, memory accesses to the EDO DRAMs is not handled the same way as an accesses to the page mode DRAM. As illustrated, at state 0, the CAS# state machine 330 is idle when a cycle (write or read) is not being driven on the address bus by the processor 102. The CAS# signal is not asserted at this state. During a read cycle to a EDO DRAM device 230, the CAS# signal is asserted by the DRAM controller 105 indicating a request to the main memory 103, the CAS# state machine transitions to state S1 to read data from an EDO DRAM bank. After a requested address has been read from the requested EDO DRAM bank location, the CAS# state machine transitions to state S3 for a precharge of the CAS# inputs and if the data requested by the processor 102 is the last in a burst, the state machine transitions back to state S0. If, on the other hand, there is more data, the state machine transitions back to state S1 for a reasserting of the CAS# signal to perform another access to the EDO DRAM bank locations after the precharging of the CAS# signal.

During a read cycle to a page mode DRAM device 225, the processor 102 initiates an access request to the DRAM banks in the main memory 103 at state S0, upon receipt of the request, the DRAM controller 105 asserts the CAS# signal at state S1. After the access to the page mode DRAM banks is completed, the state machine transitions into a wait state which lasts for a few clocks at state S2. After the wait period is over, the state machine transitions to state S3 for a precharge of the CAS# inputs. If the data requested by the processor 103 is the last one in a burst, the state machine transitions back to state S0, otherwise; the state machine transitions to state S1 where the CAS# signal is reasserted by the DRAM controller 105 for another access of the main memory 103.

Figure 5:
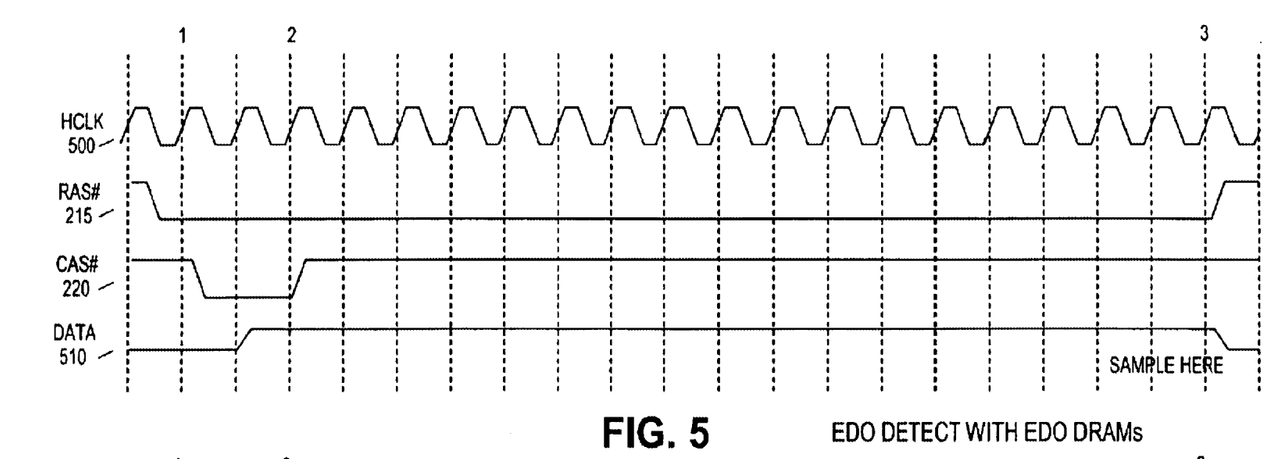
FIG. 5 is a waveform diagram of a EDO detect of a memory bank installed with EDO DRAMs in a system configured for EDO DRAMs.

Referring now to FIG. 5 is a timing diagram illustrating an EDO detect scheme for a memory bank installed with the extended data-out DRAM device. As illustrated in FIG. 5, the EDO detect scheme comprises three steps and begins at step 1 when the CAS# signal 220 is driven low at the clock labeled 1. Driving the CAS# 220 low begins a normal read of the DRAM. Data 510 is driven onto the DRAM data bus 205 after an access time.

At step 2, the CAS# signal 220 is driven high by the DRAM controller 105 at the clock labeled 2. And the EDO DRAM data continues to be driven onto the data bus.

At step 3, the data bus is sampled at the clock labeled 3. There are many clocks between the clock labeled 2 and the dock labeled 3 to allow weak pull-downs time to pull the DRAM data bus to a "0" (if the data bus had been tristated). Since the EDO DRAMs continue to drive the data bus, the correct value ("1") is sampled and the RAS# signal 215 is then driven high. Upon driving the RAS# signal 215 high, the data bus tristates and pull-down resistors then pull the data bus low to make data available. Sampling the value of the data to be a "1" indicates that a particular memory bank is installed with an EDO DRAM. The information of the bank is then loaded into the configuration register corresponding to that particular memory bank.

Figure 6:
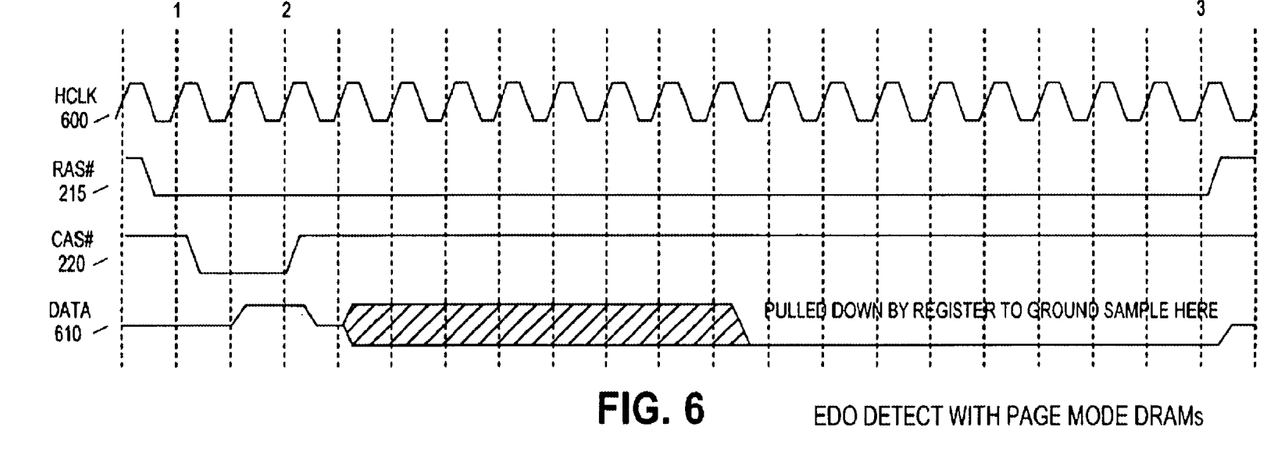
FIG. 6 is a waveform diagram of a EDO detect of a memory bank installed with page mode DRAMs in a system configured for EDO DRAMs.

FIG. 6 is a timing diagram illustrating a EDO detect scheme in a memory bank installed with page mode DRAMs. As illustrated in FIG. 6, a EDO detect of a memory bank populated with page mode DRAMs comprises three steps and begins at step 1 when the DRAM controller 105 drives the CAS# signal 220 low at the clock labeled 1 to begin a normal read cycle of the DRAM.

At step 2, after data has been driven onto the DRAM data bus, the CAS# signal 220 is driven high by the controller 105 at the clock labeled 2. Since the memory bank is installed with a standard page DRAM, the data bus tristates with the pull-down resistors pulling the data bus low.

At step 3, the data is sampled at the clock labeled 3. There are many clock between the clock label 2 and the clock labeled 3 to allow the weak pull-downs time to pull the DRAM data bus to "0". Since the standard page mode DRAMs tristate the data bus an incorrect value (0) is sampled. The information gathered is then used to configured the configuration register responsive to the memory bank.

Figure 7:
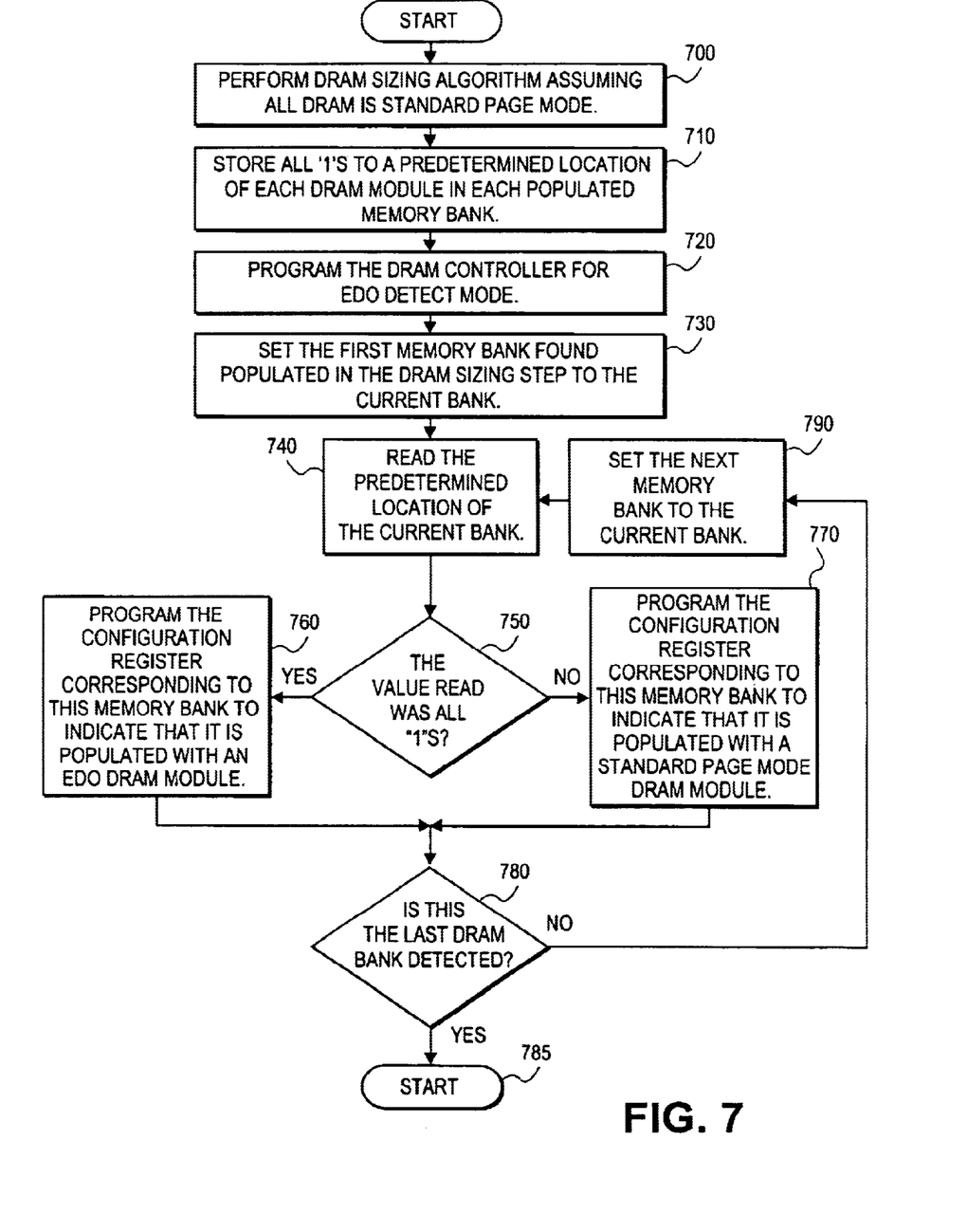
FIG. 7 is a flow chart illustrating the method of distinguishing populated memory banks populated with either the standard page mode DRAMs and the EDO DRAMs.

As illustrated by the timing diagrams in FIGS. 6 and 7, the bank detection information gives the preferred embodiment plug and play capabilities by automatically loading bank information into the configuration registers without any user intervention.

Reference is made to FIG. 7, which is a flow chart illustrating the detection logic of one embodiment of the preferred embodiment of the present invention for distinguishing between main memory banks populated with the page mode DRAMs and those populated with EDO DRAMs. As illustrated at box 700, the DRAM bank detection of the preferred embodiment begins with the system BIOS configuring the configuration registers in the memory controller with main memory bank information specifying which banks in main memory are populated with the DRAMs.

In box 710, after the sizing of the main memory banks, the detection logic configures the configuration registers to store a binary value of "1s" in each memory bank found populated with the DRAMs. At this stage of the boot up process, the memory controller assumes the main memory banks are populated with only standard page mode DRAMs. After configuring the configuration registers, processing continues at box 720.

At box 720, the detection logic programs the DRAM controller for EDO detect mode enabling the memory controller to distinguish between the memory banks containing EDO DRAMs and those containing standard page mode DRAMs. After programming the memory controller for EDO DRAM detection, processing continues at box 730.

At box 730, during a memory access to main memory 103, the DRAM controller 105 sets the first DRAM bank found at box 700 to be the current bank being accessed. After setting the first DRAM bank encountered, the DRAM controller 105 reads the location of the current DRAM bank and checks the corresponding configuration register to determine if the register contains "1"s at box 740.

If the configuration register contains "1"s based on the check at box 740, the DRAM controller 105 programs the current bank to be an EDO bank; otherwise, the current bank is programmed to be a page mode bank. After the DRAM controller 105 has been programmed to detect all the DRAM banks populated in main memory, processing continues at decision box 750.

At box 750, a determination is made whether the current DRAM bank is the last DRAM bank populated in the main memory 103. If the current bank is the last bank installed with the DRAM devices, the detection and configuration processes ends at box 785; otherwise processing continues at box 790 where the next bank being checked is set to be the current bank.

Thus, a method and apparatus for optimizing control on a bank to bank basis of a memory subsystem installed with a standard page mode DRAM device and an extended data-out DRAM device is described. From the above description, it will be apparent that the invention disclosed herein provides a novel and advantageous method and apparatus for distinguishing between the types of dynamic random access memory in a computer system. The foregoing discussion discloses and describes exemplary methods and embodiments of the present invention. As will be understood by those familiar with the art, the invention may be embodied in other specific forms without departing from its spirit or essential characteristics, and thus, the described embodiment is not restrictive of the scope of the invention. The following claims are indicative of the scope of the invention. All variations which come within the meaning and range of equivalency of the claims are to be embraced within their scope.

What is claimed is:

1. A method for accessing memory, comprising:
   determining a type of memory occupying respective memory banks by performing the operations of:
      writing a value to a memory location of a memory bank via a column control signal having a first timing characteristic corresponding to a first memory type;
      reading the memory location using a column control signal with a second different timing characteristic corresponding to a second memory type; and
      assigning a selected one of the first and second memory types to the memory bank based on a result of the reading using the column control signal with the second timing characteristic; and
   accessing the memory in a respective memory bank using control signals corresponding to the memory type assigned to that memory bank.

2. The method claim 1, further comprising: storing memory type information in at least one register.

3. The method of claim 1, wherein the first and second memory types include page mode memory and extended data out memory.

4. The method of claim 1, wherein the control signals used to access the memory include column control signals having different timing characteristics that are generated by a state machine.

5. The method of claim 4, wherein the state machine employs multiple sequences a different transition paths corresponding to respective memory types.

6. A memory controller, comprising:
   circuitry to detect a presence and type of a plurality of memory devices occupying memory banks in a computer system by performing operations including:
      writing a value to a memory location of a memory bank via a column control signal having a first timing characteristic corresponding to a first memory type;
      reading the memory location using a column control signal with a second different timing characteristic corresponding to a second memory type; and assigning a selected one of the first and second memory types to the memory bank based on a result of the reading using the column control signal with the second timing characteristic; and circuitry comprising a state machine, to generate respective control signals having different timing characteristics to access the first and second memory types.

7. The memory controller of claim 6, further comprising at least one register to store data identifying a presence and type of memory present in each of said plurality of memory banks.

8. The memory controller of claim 7, wherein said at least one register comprises a plurality of registers, each register storing data corresponding to a respective memory bank.

9. The memory controller of claim 6, wherein the first and second memory types include page mode memory and extended data out memory.

10. A computer system comprising:

a memory subsystem including a plurality of memory devices of different memory types; and a memory controller coupled to the memory subsystem including, circuitry to detect a presence and type of a plurality of memory devices occupying memory banks in a computer system by performing operations including:

writing a value to a memory location of a memory bank via a column control signal having a first timing characteristic corresponding to a first memory type;

reading the memory location using a column control signal with a second different timing characteristic corresponding to a second memory type; and assigning a selected one of the first and second memory types to the memory bank based on a result of the reading using the column control signal with the second timing characteristic; and circuitry comprising a column signal state machine to generate respective column control signals having different tinning characteristics to access the first and second memory types.

11. The computer system of claim 10, the memory controller further includes at least one register to store a plurality of bits to correspondingly denote the memory types of the memory devices, and the column signal state machine is coupled to the register and generates column control signals with different timing characteristics based on the bits stored in said at least one register.

12. The computer system of claim 10, wherein said at least one register comprises a plurality of registers, each register storing data corresponding to a respective memory device.

* * * * *

UNITED STATES PATENT AND TRADEMARK OFFICE
CERTIFICATE OF CORRECTION

PATENT NO. : 6,725,349 B2
DATED : April 20, 2004
INVENTOR(S) : Langendorf et al.

It is certified that error appears in the above-identified patent and that said Letters Patent is hereby corrected as shown below:

Column 10,
Line 15, after "claim 10," insert -- wherein --.

Signed and Sealed this

Twenty-ninth Day of June, 2004

JON W. DUDAS
*Acting Director of the United States Patent and Trademark Office*